United States Patent
Yoon et al.

(10) Patent No.: US 7,452,817 B2
(45) Date of Patent: Nov. 18, 2008

(54) CMP METHOD PROVIDING REDUCED THICKNESS VARIATIONS

(75) Inventors: Ilyoung Yoon, Gyeonggi-do (KR); Jae Ouk Choo, Gyeonggi-do (KR); JaEung Koo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 41 days.

(21) Appl. No.: 11/543,200

(22) Filed: Oct. 5, 2006

(65) Prior Publication Data
US 2007/0167014 A1    Jul. 19, 2007

(30) Foreign Application Priority Data
Jan. 17, 2006    (KR)    .................. 10-2006-0004876

(51) Int. Cl.
*H01L 21/032*    (2006.01)
*H01L 21/461*    (2006.01)

(52) U.S. Cl. ............... 438/692; 438/689; 257/E21.267; 257/E21.293; 257/E21.304

(58) Field of Classification Search ................ 438/692, 438/689, 786, 787, 791
See application file for complete search history.

(56) References Cited

U.S. PATENT DOCUMENTS

| 5,385,866 | A |  | 1/1995 | Bartush |
| 5,928,960 | A |  | 7/1999 | Greco et al. |
| 6,245,635 | B1 | * | 6/2001 | Lee .......................... 438/407 |
| 6,261,914 | B1 |  | 7/2001 | Divakaruni et al. |
| 6,302,767 | B1 | * | 10/2001 | Tietz ........................... 451/41 |
| 6,617,251 | B1 |  | 9/2003 | Kamath et al. |
| 6,887,137 | B2 | * | 5/2005 | Lee et al. ....................... 451/57 |
| 6,914,001 | B2 | * | 7/2005 | Lee et al. .................... 438/692 |
| 7,066,801 | B2 | * | 6/2006 | Balijepalli et al. .......... 451/526 |
| 7,276,446 | B2 | * | 10/2007 | Robinson et al. ............ 438/690 |
| 2004/0127045 | A1 |  | 7/2004 | Gorantla et al. |

FOREIGN PATENT DOCUMENTS

KR    1020010059995 A    7/2001

* cited by examiner

*Primary Examiner*—David Nhu
(74) *Attorney, Agent, or Firm*—Volentine & Whitt, PLLC

(57) ABSTRACT

A chemical mechanical polishing (CMP) method is disclosed for use in the fabrication of a semiconductor device having dense and sparse regions. The method uses an abrasive stop layer formed on the dense and sparse regions to control polishing of a material layer formed on the abrasive stop layer by a rigid, fixed abrasive polishing pad.

25 Claims, 9 Drawing Sheets

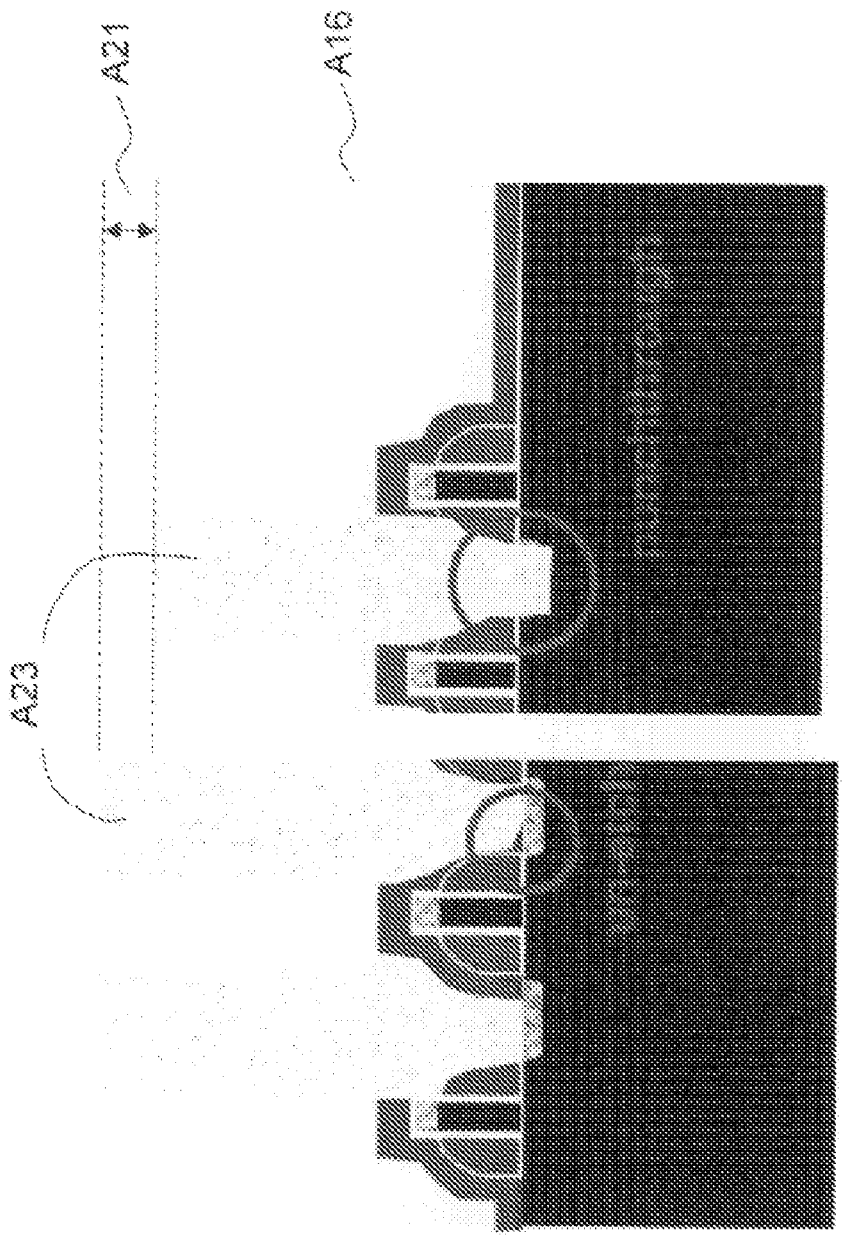

CMP METHOD PROVIDING REDUCED THICKNESS VARIATIONS

BACKGROUND OF THE INVENTION

1. Field of the Disclosure

Embodiments of the invention relate to chemical/mechanical polishing (CMP) processes, such as those adapted for use in the fabrication of microelectronic devices. More particularly, embodiments of the invention relate to CMP processes yielding material layers having reduced thickness variations.

2. Description of the Related Art

As microelectronic devices, such as those formed on semiconductor substrates, become ever more densely integrated, the material layer planarization processes used to fabricate such devices become more and more critical. That is, since highly integrated semiconductor devices typically include stacked material layers and related interconnections, the upper surface flatness and regular thickness of a material layer are critical design parameters. Any unevenness or irregularity (e.g., non-uniform thickness and/or non-planar surface condition) of the substrate or an intermediate material layer presents a variety of problems which are well-documented in the art.

Accordingly, planarization processes are applied at various stages within the sequence of fabrication processes used to manufacture semiconductor devices. Planarization processes are used to minimize irregularities and thickness variations in a substrate layer or an intermediate material layer. (Hereafter, either the actual surface of a substrate material, and/or the surface of one or more material layers formed on the substrate being subjected to planarization will be generally referred to as "the working surface").

One common planarization technique is known as chemical/mechanical polishing (CMP). In CMP, a working surface is pressed against a rotating polishing pad. An abrasive and/or a chemically reactive solution known as a "slurry" is then introduced onto the polishing pad. The mechanical effect of the pressure applied through the polishing pad and the chemical reaction resulting from of introduction of the slurry selectively remove material from the working surface and produce a more uniform material layer.

Once a working surface has been polished using a CMP process, it may be used as a substrate (i.e., an underlying layer) for another material layer. In this manner, contemporary semiconductor devices are formed from multiple stacked material layers.

A difficulty commonly encountered during CMP processing is one in which different rates of polishing (i.e., the respective rates of material removal) arise for different materials forming a working surface. Additionally, different polishing rates may be encountered for different regions of the working surface, regardless of their relative material composition. Thus, care must be taken to avoid over-polishing, under-polishing, or uneven polishing within disparate regions of a working surface or across disparate materials forming the working surface.

For example, one common form of selective over-polishing results in a so-called "dishing effect." FIGS. 1A and 1B depict a portion of an exemplary working surface of a semiconductor substrate A10. Working surface A10 includes an area of dense element formation and an area of less dense (e.g., wide open) element formation on a substrate material layer A12. Selected portions of substrate material layer A12 have been previously removed to form, for example, trench structure A22 and well structures A18 and A20. A material layer A16, such as an interlayer dielectric (ILD), is then formed to substantially cover substrate material layer A12 and to fill trench structure A22 and well structures A18 and A20.

ILD layer A16 may be formed of multiple layers, but is commonly formed to insulate other material layers such as insulation layer A24 and patterned conductive layer A14 formed on substrate material layer A12. As formed over all of these intervening material layers and associated elements, the upper surface of ILD layer A16 is significantly uneven. Such unevenness prevents the practical formation of additional material layers or components on the upper surface of ILD layer A16. Thus, a planarization (e.g., a CMP) process is commonly applied to working surface A10 to planarize ILD layer A16.

Unfortunately, the disparate natures of the wide open area and the dense area, as well as the different material compositions of ILD layer A16 and conductive layer A14 make even planarization very difficult to achieve. As shown in FIG. 1B, for example, the portion of ILD layer A16 overlaying the wide open area is commonly over-polished relative to the remainder of working surface A10. The dish shaped over-polishing defect A26 formed in working surface A10 potentially may subsequently result in the faulty formation of an overlying material layer.

FIGS. 1C and 1D illustrate two possible fabrication defects associated with uneven polishing of a working surface. FIGS. 1C and 1D illustrate different regions of a substrate in which an ILD layer A16 has been formed with an uneven thickness (e.g., difference A21) as between the two regions. Because ILD layer A16 is relatively thick in the region of FIG. 1C, an under-etching of related material layer results in a partial contact failure between connection element A23 and an underlying conductive region of the substrate. In contrast, the relatively thin nature of ILD layer A16 in the region of FIG. 1D results in an over-etching of the related material and punch-through by connection element A23.

While a considerable number of approaches have been developed to abate such polishing defects, most of these approaches suffer from a number of their own problems, such as unpredictable performance, lengthy processing times, inefficient and costly procedures, etc. For example, U.S. Pat. No. 5,385,866 describes a CMP process that uses a barrier film made of nitride disposed over a special polish stop layer formed from boron nitride (or oxidized boron nitride). The polish stop layer, in turn, is disposed atop a number of transistor gates. While the barrier film is used to protect the transistor gates, the planarization process must cut through the barrier film to reach the polish stop layer before planarization is considered complete. While the polish stop layer appears to provide an adequate hard stop over each transistor gate, the different removal rates between the polish stop layer and an insulating layer disposed over the barrier film and polish stop layer may be improved. However, this approach to CMP provides only a mediocre rate of material removal and fails to adequately address the problem of dishing in substrates having both relatively dense and sparsely populated regions.

Published United States Patent Application No. 2004/0127045 describes a CMP process wherein nano-sized abrasive particles are added to a slurry to increase the rate of polishing. Further, U.S. Pat. No. 6,914,001 to Lee et al. describes a CMP process wherein both nano-sized abrasive particles and one or more passivation agents are added to a slurry to increase the rate of material removal and provide removal selectivity between different material layers. However, as before, these conventional approaches do not address the problem of dishing in substrates having both relatively dense and sparsely populated regions.

Indeed, the requirement for a highly effective and efficiently applied CMP process adapted planarize the working surface of a material layer formed on a substrate having densely filled and wide open regions remains unmet. Current approaches still result in either very slow CMP processing times, uncontrolled and unpredictable results, and polishing defects, such as the dishing effect.

SUMMARY OF THE INVENTION

In one embodiment, the invention provides a chemical mechanical polishing (CMP) method adapted for use in the fabrication of a semiconductor device. The method comprises contacting a material layer disposed on a working surface of a substrate with a rigid, fixed abrasive polishing pad to planarize the material layer by removing a portion of the material layer until a portion of an abrasive stop layer disposed under the material layer is exposed.

In another embodiment, the invention provides a method of fabricating a semiconductor device on a substrate, the substrate including dense and sparse regions, and the method comprising; forming an abrasive stop layer on the dense and sparse regions, forming a material layer on the abrasive stop layer, and planarizing the material layer with a rigid, fixed abrasive polishing pad until a portion of the abrasive stop layer on the dense region is exposed.

In another embodiment, the invention provides a method of fabricating a semiconductor device disposed in a dense region and a sparse region of a substrate, the method comprising; forming an abrasive stop layer on at least the dense region of the substrate, forming a first interlayer dielectric layer on the substrate to cover the abrasive stop layer in the dense region and the sparse region, while introducing a slurry comprising a passivation agent selected in relation to the abrasive stop layer, planarizing the first interlayer dielectric layer using a rigid, fixed abrasive polishing pad until the abrasive stop region exposed and after planarizing the first interlayer dielectric layer, forming a uniformly thick second interlayer dielectric layer on the substrate.

DESCRIPTION OF THE DRAWINGS

Embodiments of the invention are described hereafter with reference to the accompanying drawings. It should be noted, however, that the various drawing features are not necessarily drawn to scale. In fact, the relative dimensions of the various features may be arbitrarily increased or decreased to add clarity to the description. Wherever applicable and practical, like reference numerals refer to like or similar elements.

FIGS. 1A through 1D depict portions of a semiconductor substrate undergoing a conventional Chemical/Mechanical Polishing (CMP) process;

DESCRIPTION OF EMBODIMENTS

In the following description, provided for purposes of explanation and not limitation, example embodiments are set forth in order to teach the making and use of the invention. However, it will be apparent to those of ordinary skill in the art having had the benefit of the subject disclosure that other embodiments of the invention are possible.

Figure 1A:
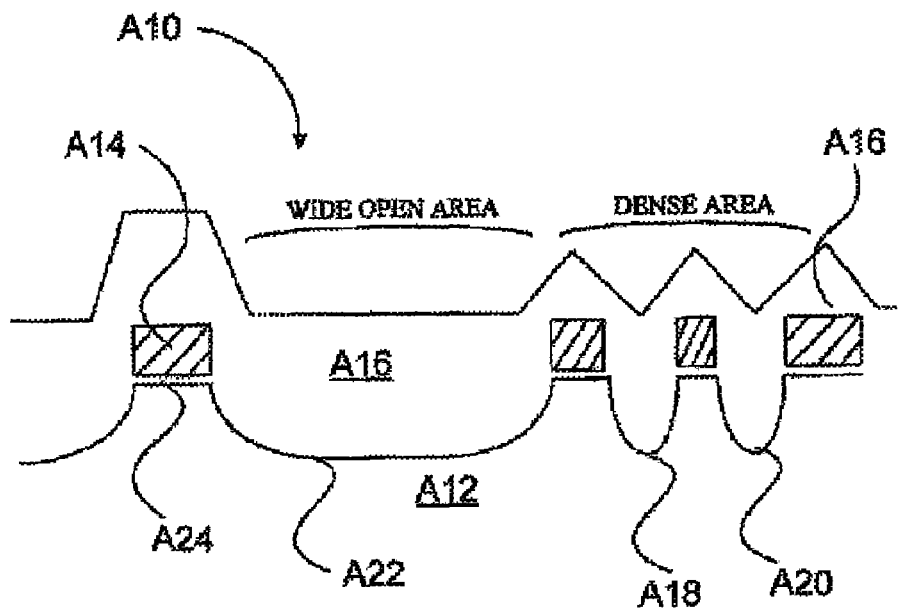
Figure 1B:
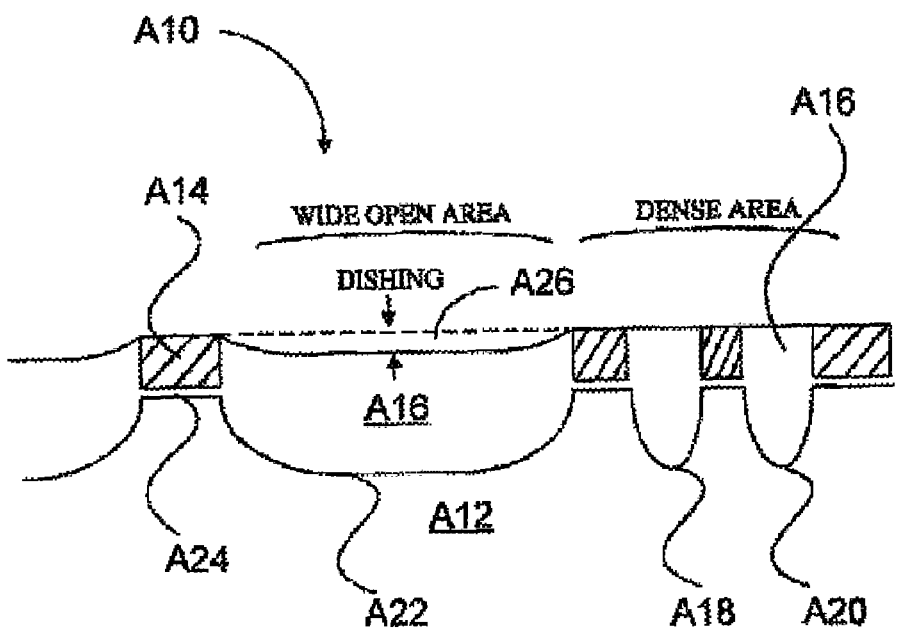
Figure 2:
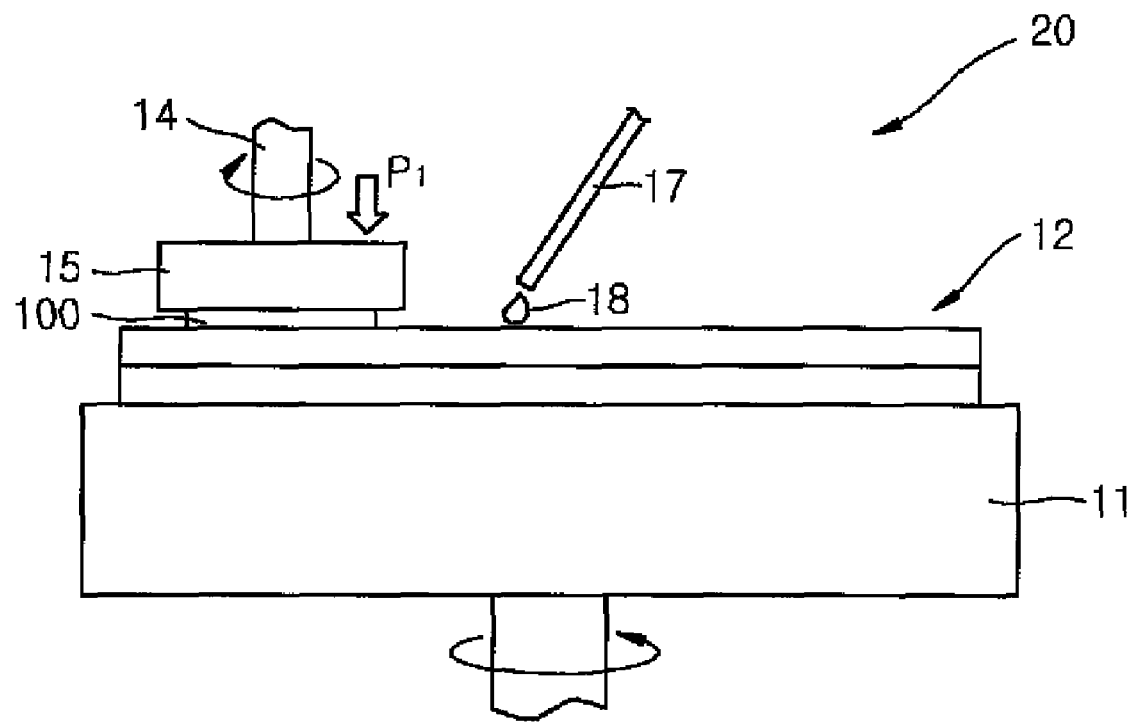
FIG. 2 illustrates an exemplary polishing device which may be adapted for use with embodiments of the invention.

FIG. 2 shows an exemplary polishing device 20 which may be adapted for use with the various methods and systems of the teaching embodiments. As shown in FIG. 2, polishing device 20 comprises a large rotatable platen 11 mounting a polishing pad 12. While many polishing mechanisms and arrangements are susceptible to the benefits of the invention, polishing devices employing a fixed abrasive pad as polishing pad 12 are particularly benefited. A smaller rotatable carrier 15 mounted on a spindle 14 is used to affix a substrate 100. A chemical slurry 18 may be controllable introduced onto polishing pad 12 through a supply device 17. Chemical slurry 18 may include an additional abrasive material or may be abrasive-less.

In operation, platen 11 and carrier 15 rotate in relation to one another, such that an omni-directional polishing of the working surface of substrate 100 is obtained by means of polishing pad 12. Additionally, a pressure P is carefully applied between carrier 15 and platen 11 to control the polishing process of substrate. The pressure-controlled mechanical polishing of substrate 100 in the presence of slurry 18 allows selective removal of portions of the material layer apparent on an exposed surface of substrate 100. The actual rate of material removal is dependent on a number of factors, including pressure P, the nature of the constituent materials, and the composition of slurry 18.

Pressure P1 may be formed by multiple influences, and will be controlled in relation to a number of variables. For example, one particular value for pressure P is known as the "threshold pressure." Threshold pressure is a pressure at which the rate of removal for a particular material layer apparent on the substrate's working surface changes dramatically. Below the threshold pressure, the rate of material layer removal is typically small. Thus, values for pressure P below the threshold pressure may be beneficially applied to obtain precise control over the polishing process. In contrast, values for pressure P above the threshold pressure may be beneficially applied to obtain the rapid removal of bulk material.

Figure 8:
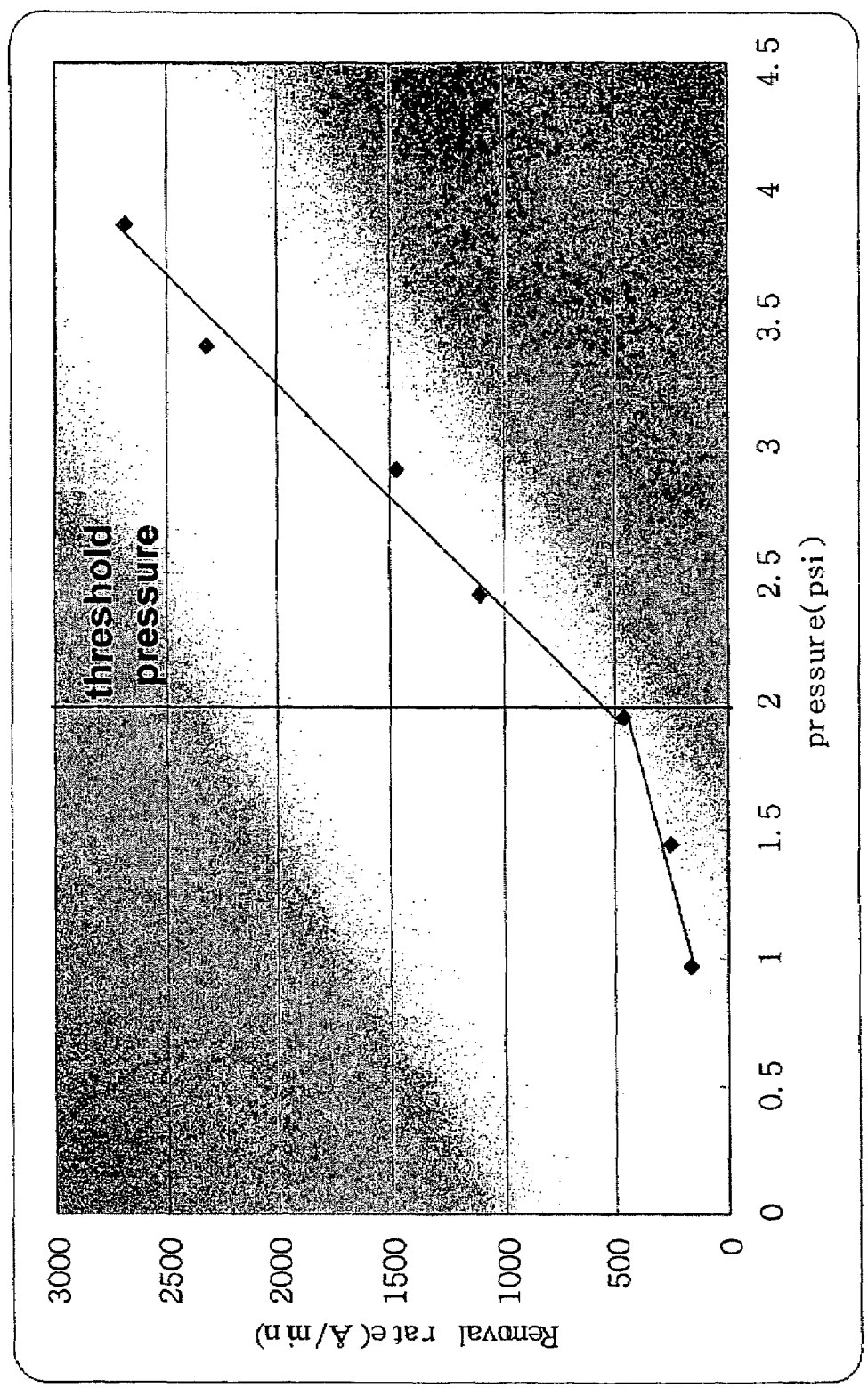
FIG. 8 is a graph further illustrating a relationship between pressure applied to a semiconductor substrate during an exemplary CMP process and the resultant rate of removal of a material layer from a working surface of the substrate.

FIG. 8 is a graph further illustrating the relationship of pressure P with the rate of removal for an exemplary material layer. The results illustrated in FIG. 8 are drawn to a system using a fixed abrasive pad to polish an interlayer dielectric (ILD) layer formed on the working surface of a test substrate. As can be seen from FIG. 8, two distinct slopes for the rate of material removal are identified in relation to a threshold pressure Pth of about the 2 pounds per square inch (PSI). Of note, the relative rates of material removal above the threshold pressure Pth increase much more quickly for each additionally applied unit of pressure, as compared with the relative rates of material removal below the threshold pressure Pth.

Returning to FIG. 2, the pressure P exerted on substrate 100 may be very unevenly applied across its working surface. This uneven (e.g., regionally disparate) application of pressure to the working surface of substrate 100, often due to an uneven population density of components in disparate regions, results in the defects noted above.

Consider, for example, the following hypothetical situation. A substrate 100 is polished in a polishing device such as the one shown in FIG. 2. Initially, only about 25% of the substrate's working surface is in contact with polishing pad 12 (assumedly a rigid fixed abrasive pad). Assuming an applied total pressure P, the average local pressure actually applied to contact points between the working surface and the polishing pad is equal to about four times P. In contrast, the remaining non-contacting portions of the working surface are not mechanically polished at all. Thus, the rate of material removal for the contact points of the working surface will initially correspond to an applied pressure of 4P.

However, after an initial period of polishing, the original contact points of the working surface have been removed, such that about 50% of the substrate's working surface is now in contact with polishing pad 12. The local pressure actually applied to the contact points between the working surface and the polishing pads falls to about two times P. Finally, once a considerable amount of material has been removed from the working surface, the entirety of the working surface comes into contact with the polishing pad and the corresponding actual rate of material removal falls to one associated with pressure P. This dynamic "actual" (and locally disparate) application of pressure to the working surface must be carefully accounted for and controlled in order to obtain a smooth working surface of regular thickness.

Another important aspect of CMP is known as the "selectivity." The selectivity of a CMP process is dependent on the nature of the materials being polished and the composition of an applied slurry, if any. The selectivity of a given slurry is generally defined as the ratio between two different removal rates for two different materials. For example, the selectivity of a slurry formed from deionized water and an abrasive agent (e.g., ceria, silica, alumina, titania, zirconia or germania) relative to an interlayer dielectric (ILD) (e.g., tetraethyl orthosilicate (TEOS)) and an abrasive stop layer (e.g., silicon nitride (SiN)) is about 6:1. However, by adding a passivation agent (e.g., carbolic acid, phosphoric acid, sulfonic acid, amine or sulfuric ester (or any of their respective salts), L-proline, etc.) to the slurry changes the selectivity of the CMP process from 6:1 to 106:1.

Further information regarding slurries, slurry selectivity, and the various effects of additional passivation agents may be had from a review of U.S. Pat. Nos. 6,914,001 and 6,887,137, the collective subject matter of which is hereby incorporated by-reference.

Figure 3:
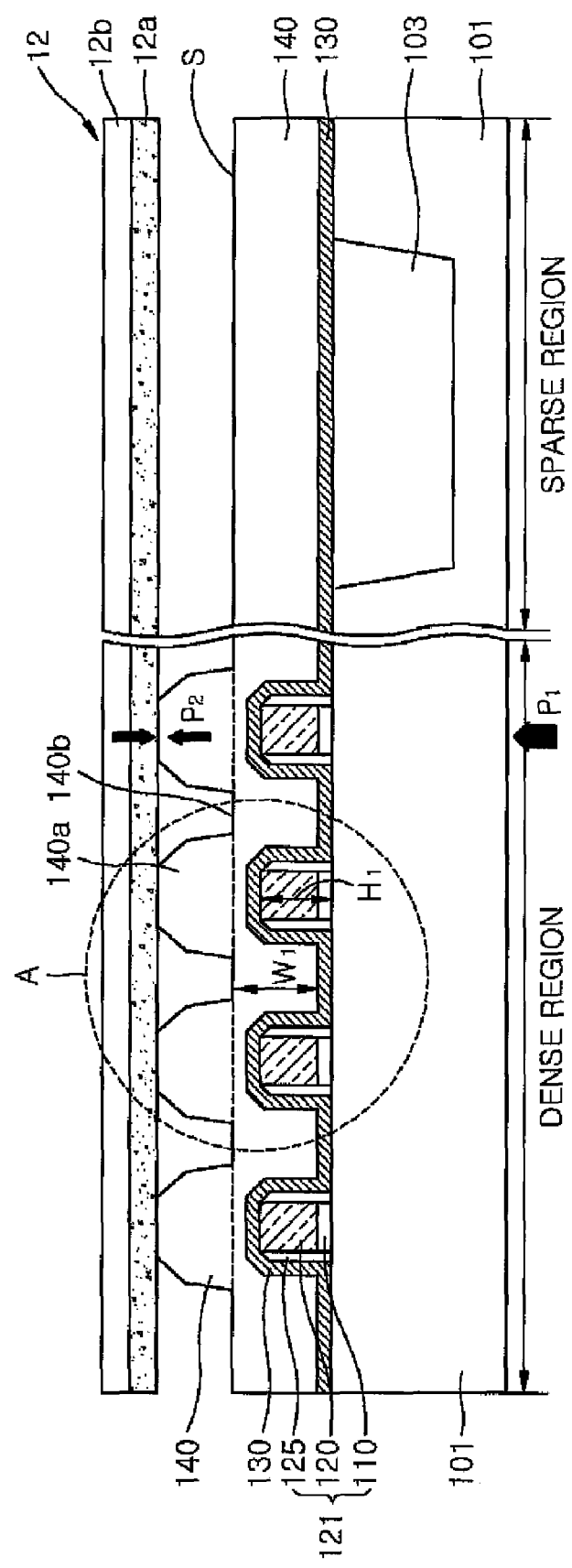
FIGS. 3-7 depict various portions of exemplary semiconductor substrates undergoing a planarization process according to embodiments of the invention.

FIG. 3 depicts an exemplary semiconductor device undergoing a CMP process. A substrate 101 is placed in contact with a rigid polishing pad 12. In the illustrated embodiment, rigid polishing pad 12 comprises a base 12b and an abrasive layer 12a.

Polishing pad 12 is applied to an uneven working surface (S) of substrate 101. This unevenness results to a great degree from the relative vertical profiles of a dense region and a relatively sparse region of the working surface. In the illustrated example, the dense region is assumed to be a region of the working surface containing a memory cell array including a number of gate structures 121. Each gate structure has a first height H1 and comprises a conductive layer 120, a dielectric layer 110, and sidewall spacers 125.

In the illustrated example, the relatively sparse region is assumed to be a peripheral circuit region associated with memory cell region. The sparse region contains only an isolation structure 103 (e.g., silicon oxide) embedded in substrate 101.

An abrasive stop layer 130 is uniformly formed (e.g., deposited) on the working surface of substrate 101 to cover the dense region (e.g., the plurality of gate structures) and the sparse region (e.g., isolation structure 103). An interlayer dielectric layer (ILD) 140 is them formed on abrasive stop layer 30. ILD layer 140 is formed with a uniform thickness W1 and may be conceptually divided into two separate regions or thickness portions, including; a first ILD region 140a initially in contact with polishing pad 12, and a second ILD region 140b initially not in contact with polishing pad 12.

In the example illustrated in FIG. 3, abrasive stop layer 130 is formed from silicon nitride and ILD 140 is formed from TEOS. However, the particular composition and thickness of abrasive stop layer 130 will vary by application and in relation to the composition of the overlaying material layer (e.g., ILD layer 140). In similar vein, an interlayer dielectric layer is assumed for purposes of illustration, but embodiments of the invention are not so limited. Indeed, a conductive or metal layer might be substituted for ILD layer 140. Further, other non-conductive materials, such as an HLD oxide, might be used within the illustrative context of the ILD layer 140.

Figure 4:
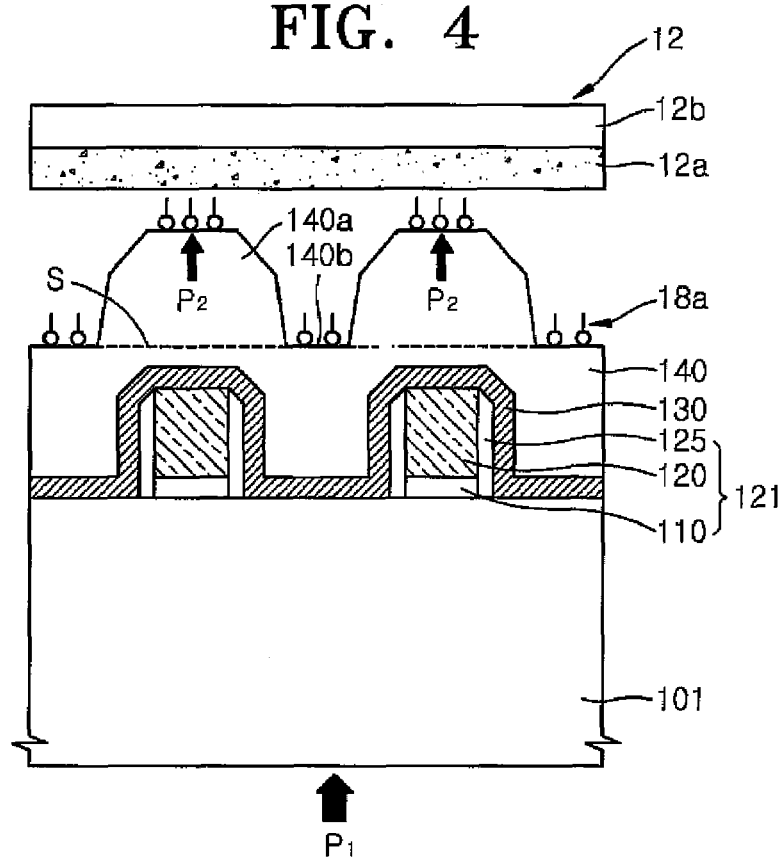

Section "A" of FIG. 3 is shown in some additional detail in FIG. 4. A pressure P1 is assumedly exerted on substrate 101 to bring the working surface in contact with polishing pad 12. The foregoing discussion in mind, the actual local pressure applied to the first ILD region 140a will be some greater multiple of pressure P1 denoted pressure P2. The relationship between P1 and P2 is given by equation (1) below:

$$P2 = P1 \times (A1/A2), \tag{1}$$

where A1 is the entire area of substrate 101, A2 is the total area of first ILD region 140a in contact with polishing pad 12. A general relationship between the exerted total pressure P1 and an actual pressure P2 applied to a certain portion of the working surface may therefore be expressed by equation (2) below:

$$P2/P1 = A1/A2, \tag{2}$$

where A1 is the entire area of substrate 101, A2 is the total area of the working surface of substrate 101 in contact with polishing pad 12 at any moment in time.

Figure 5:
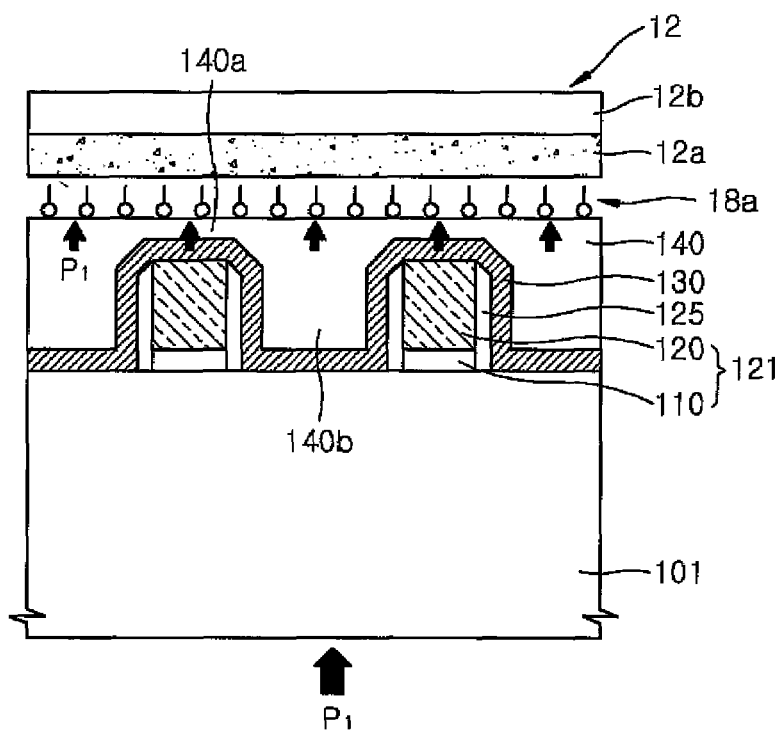

Compare, for example, the respective situations illustrated in FIG. 4 and FIG. 5, where FIG. 5 depicts the same region of the working surface of substrate 101 shown in FIG. 4 at a later time point in the polishing of the working surface. By this point in time, first ILD region 140a has been removed, such that the working surface in contact with polishing pad 12 now extends across the entire substrate 101. Thus, A2 is now equal to A1, and P2 correspondingly falls with respect to the actual pressure applied in FIG. 4 to P1 in FIG. 5.

Again referring to FIG. 8 in the context of the examples shown in FIGS. 4 and 5, it should be appreciated that the rate of material removal for ILD layer 140 will fall with the reduction in actual applied pressure P2. Thus, the rate of material removal will slow as P2 approaches P1, and will particularly fall if during this transition P2 crosses a corresponding threshold pressure PTH. That is, if it is assumed that the relationship shown in equation (3) holds true, $$P1 \leq Pth \tag{3}$$

the relationship shown in equation (4) must also hold true.

$$[(A2/A1) \cdot Pth] \leq P1 \leq Pth \tag{4}$$

In view of equations (3) and (4), it will be appreciated that, because the rate of material removal for any constituent layer falls as P2 moves towards P1, the finishing effects of the overall CMP process may be finely controlled relative to the initial material removal effects, without sacrificing the speed with which the initial material removal should be accomplished. Thus, the foregoing embodiments illustrate a method by which portions of a working surface "earlier" contacting a polishing pad during a CMP process are removed with a greater rate of material removal than portions of the working surface "later" contacting the polishing pad. In this manner, overall application of the CMP process does not take overly long, yet dishing and similar defects are not formed because the finishing effects of the CMP process are well controlled.

Figure 6:
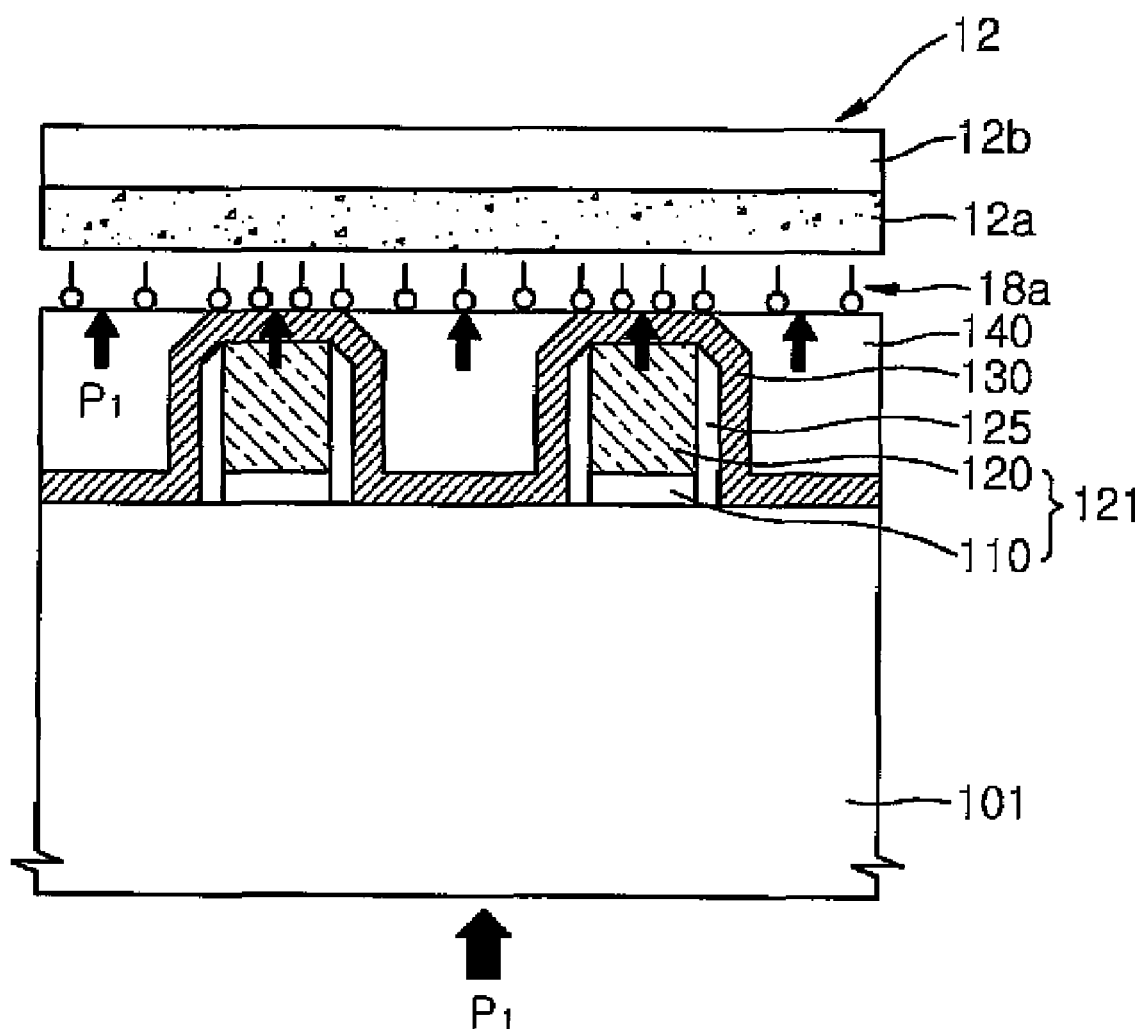

FIG. 6 further illustrates the same portion of substrate 101 shown in FIGS. 4 and 5 at a later point in the CMP process. Here, ILD layer 140 has been removed down to the upper surface of abrasive stop layer 130. Because of a defined selectivity between abrasive stop layer 130 and ILD layer 140 (e.g., 106:1 in one embodiment), contact between abrasive stop layer 130 and polishing pad 12 causes a further dramatic reduction in the rate of material removal for portions of ILD layer 140.

Throughout FIGS. 4, 5, and 6, the relative effect of an optionally provided passivation agent is indicated by symbols 18a.

Figure 7:
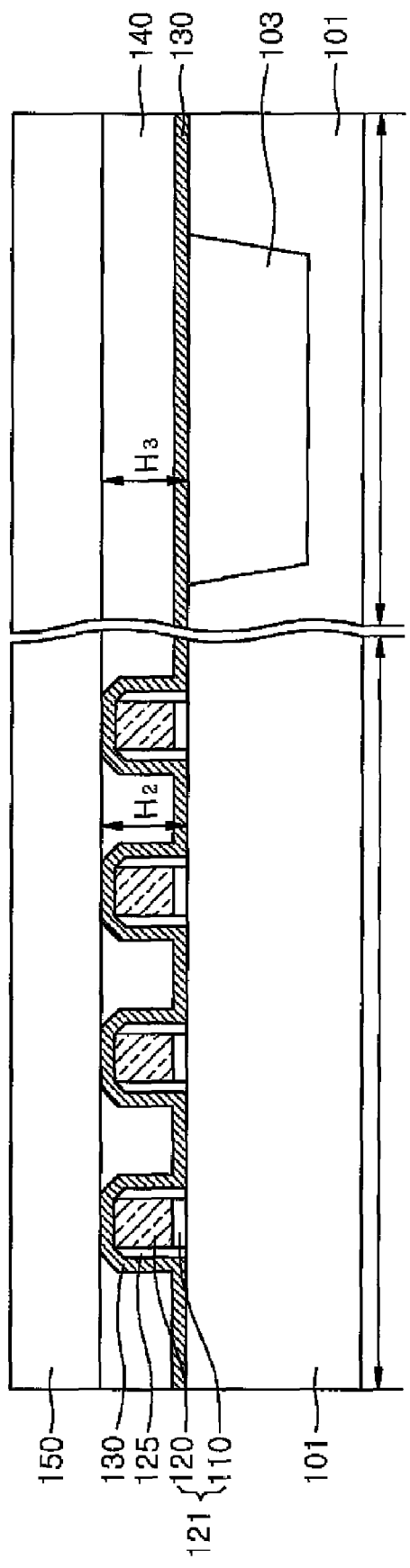

Continuing to FIG. 7, it should be appreciated that the above-described embodiments of the inventive CMP process can consistently produce a planarized material layer (e.g., ILD layer 140) stretching across both densely and sparely populated regions of a substrate and yet having a variation in thickness (e.g., H2-H3 in the illustrated example) of less than 200 angstroms. Thus, the dishing effect observed in the sparse regions of conventional substrates may be effectively eliminated.

Having provided a remarkably flat and uniformly thick material layer as an upper surface of substrate 101, an overlayer, such as a second ILD 150, may be formed on polished ILD layer 140 using conventional processes, such as a chemical vapor deposition (CVD) process. In this manner, a final ILD layer may be formed with a highly precise thickness. In one example, a final 3,000 angstrom ILD layer was formed to a tolerance of ±100 angstroms.

Figure 9:
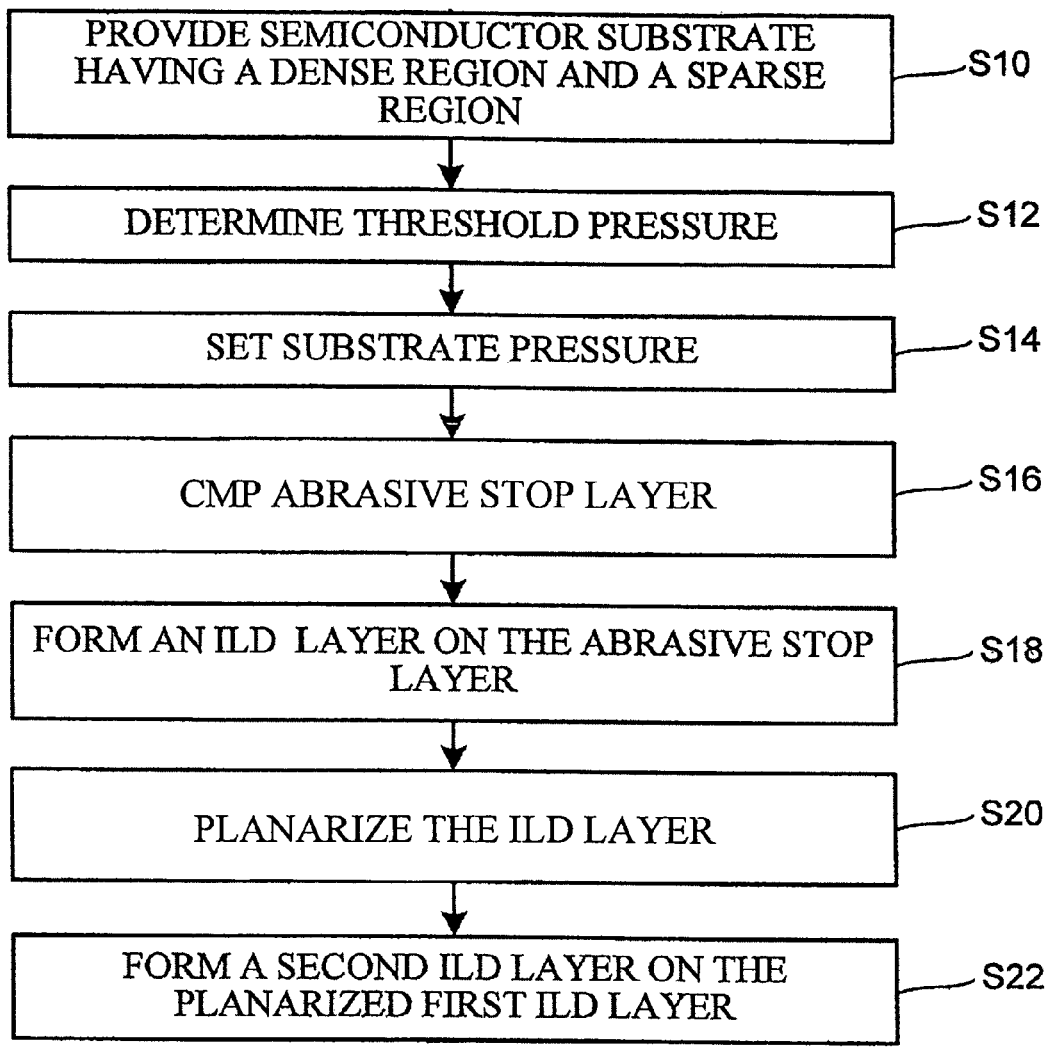
FIG. 9 is a flowchart outlining an exemplary CMP process consistent with embodiments of the invention.

FIG. 9 is a flowchart outlining one embodiment of a method consistent with the present invention and well adapted to planarize a working surface of a semiconductor substrate. The exemplary method begins with the assumption that a semiconductor substrate including both dense and sparse regions has been provided (S10). The overall topology of the substrate, including the dense and sparse regions is considered in subsequent selections and definitions of applied total pressure, material selectivity, and/or the inclusion of a passivation agent.

Thus, with an understanding of the topology of the working surface of the substrate, a threshold pressure PTH is determined in relation to the composition of the material(s) forming the working surface, as well as the nature of the polishing equipment being used, and the expected application of a particular polishing slurry including a passivation agent, if any (S12). With the threshold pressure PTH in mind, a polishing pressure P is set for the substrate (S14). The polishing pressure may be a single fixed value to be applied throughout the polishing process or it may be a range of temporally related values defined in relation to the equations (3) and (4) above, for example.

With an understanding of the composition of the material layer to be polished and a corresponding polishing pressure determined, an abrasive stop layer (e.g., a silicon nitride layer) may be selected and formed on the working surface of the substrate over both densely and sparsely populated regions (S16). The material layer to be polished (e.g. an ILD layer) may then be formed on the abrasive stop layer (S18). Following formation of the material layer over the dense and sparsely populated regions, it may be planarized using the inventive CMP process down to the abrasive stop layer (S20). In one embodiment, the total pressure (P1) applied to the substrate will initially create a first actual applied pressure (P2) greater than the calculated threshold pressure (PTH) on portions of the working surface contacting the polishing pad. As the CMP polishing process continues, the actual pressure (P2) will fall as a greater portion of the working surface comes into contact with the polishing pad until the actual pressure becomes close to the total applied pressure (P1). The combine effect of an increasing contact area, the abrasive stop layer, and/or an added passivation agent slows the polishing process at the final finishing stages of the CMP process Once the CMP process is complete, an overlaying material layer (e.g., a second ILD layer) may be formed on the planarized material layer (S22).

The foregoing exemplary method is particularly effective when a rigid polishing pad is used to effect the CMP process.

In various embodiments where the above-described systems and/or methods may be implemented using a programmable device, such as a computer-based system or programmable logic, it should be appreciated that the above-described systems and methods can be implemented using any of various known or later developed programming languages, such as "C", "C++", "FORTRAN", "Pascal", "VHDL" and the like.

Accordingly, various storage media, such as magnetic computer disks, optical disks, electronic memories and the like, may be prepared that can contain information adapted to direct the operation of a polishing device. Once an appropriate control device, such as a computer, has access to such information and programs it may enable the polishing device to perform the above-described methods.

For example, if a computer disk containing appropriate materials, such as a source file, an object file, an executable file or the like, were provided to a computer, the computer could receive the information, appropriately configure itself and perform the functions of the various systems and methods outlined in the diagrams and flowcharts above to implement an embodiment of the invention. That is, the computer could receive various portions of information from the disk relating to different elements of the above-described systems and/or methods, implement the individual systems and/or methods and coordinate the functions of the individual systems and/or methods described above.

Those of ordinary skill in the art will further recognize that many variations, modifications and adaptations to the foregoing embodiments may be made without removing such from the scope of the invention as defined by the appended claims. For example, the illustrative embodiments have been drawn to particular examples of substrates, material layers, and related CMP processes. Those of ordinary skill recognize that merely changing the assumed starting and/or working materials will change range of pressures, passivation agents, etc., identified above as being potentially applicable to embodiments of the invention.

What is claimed:

1. A chemical mechanical polishing (CMP) method adapted for use in the fabrication of a semiconductor device, the method comprising:
   determining a threshold pressure in relation to a material layer disposed on a working surface of a substrate;
   pressing together a rigid, fixed abrasive polishing pad to and the working surface of the substrate with a pressure less than the threshold pressure in order to planarize the material layer by removing a portion of the material layer until a portion of an abrasive stop layer disposed under the material layer is exposed.

2. The CMP method of claim 1, further comprising introducing a polishing slurry to the polishing pad.

3. The CMP method of claim 2, wherein the polishing slurry is an abrasive-less slurry.

4. The CMP method of claim 2, wherein the polishing slurry comprises a passivation agent adapted to define a polishing selectivity between the material layer and the CMP stop layer.

5. The CMP method of claim 4, wherein the passivation agent selectively passivates the CMP stop layer to inhibit removal of the CMP stop layer by the polishing pad surface.

6. The CMP method of claim 1, wherein the material layer comprises an interlayer dielectric layer.

7. The CMP method of claim 6, wherein the interlayer dielectric layer comprises an oxide, and the abrasive stop layer comprises a nitride.

8. The CMP method of claim 6, further comprising:
   forming a second interlayer dielectric layer on the planarized interlayer dielectric layer.

9. The CMP method of claim 1, wherein the material layer comprises at least one of a metal and a metal alloy.

10. The CMP method of claim 1, wherein pressing together the polishing pad and the working surface of the substrate comprises:
    applying pressure to the substrate against the polishing pad.

11. The CMP method of claim 10, wherein the material layer comprises a first material region formed on a densely integrated portion of the substrate and a second material region formed on a sparsely integrated portion of the substrate, wherein the first material region protrudes above the second material region; and
    planarizing the material layer by removing a portion of the material layer comprises; initially removing the first material region in its entirety by application of a first material region localized pressure greater than the threshold pressure, and thereafter planarizing the second material region using the pressure less than the threshold pressure.

12. A method of fabricating a semiconductor device on a substrate, the substrate including dense and sparse regions, and the method comprising:
    forming an abrasive stop layer on the dense and sparse regions;
    forming a material layer on the abrasive stop layer;
    defining a threshold pressure in relation to the material layer;
    planarizing the material layer with a rigid, fixed abrasive polishing pad until a portion of the abrasive stop layer on the dense region is exposed, wherein planarizing the material layer comprises applying a first pressure between the substrate and the polishing pad less than the threshold pressure.

13. The fabrication method of claim 12, wherein the material layer comprises a first interlayer dielectric layer, and the method further comprises:
    forming a second interlayer dielectric layer on the planarized first dielectric layer.

14. The fabrication method of claim 12, further comprising defining a polishing selectivity between the material layer and the abrasive stop layer by introducing a slurry during the planarization of the material layer.

15. The fabrication method of claim 14, wherein the slurry comprises a passivation agent selected in relation to the abrasive stop layer.

16. The fabrication method of claim 12, wherein the material layer comprises a metal or a metal alloy.

17. A method of fabricating a semiconductor device disposed in a dense region and a sparse region of a substrate, the method comprising:
    forming an abrasive stop layer on at least the dense region of the substrate;
    forming a first interlayer dielectric layer on the substrate to cover the abrasive stop layer in the dense region and the sparse region;
    while introducing a slurry comprising a passivation agent selected in relation to the abrasive stop layer, planarizing the first interlayer dielectric layer using a rigid, fixed abrasive polishing pad until the abrasive stop layer is exposed; and,
    after planarizing the first interlayer dielectric layer, forming a uniformly thick second interlayer dielectric layer on the substrate.

18. The fabrication method of claim 17, wherein the CMP abrasive stop layer comprises a nitride and is formed on both the dense and sparse regions of the substrate.

19. The fabrication method of claim 17, wherein planarizing the first interlayer dielectric layer comprises applying a pressure to the substrate against the polishing pad less than a threshold pressure defined in relation to the first interlayer dielectric.

20. The fabrication method of claim 19, wherein the slurry comprises at least one abrasive material selected from a group of abrasive materials consisting of ceria, silica, alumina, titania, zirconia, and germania.

21. The fabrication method of claim 19, wherein the passivation agent comprises at least one material selected from a group of materials consisting of carbolic acid, phosphoric acid, sulfonic acid, amine, sulfuric ester and L-proline.

22. The fabrication method of claim 21, where the passivation agent changes the selectivity between the interlayer dielectric layer and the abrasive stop layer by at least a factor of ten times.

23. The fabrication method of claim 17, wherein the planarizing of the first interlayer dielectric layer comprises:
    initially removing material from the first interlayer dielectric material at a first removal rate; and thereafter,
    removing material from the first interlayer dielectric layer at a second removal rate less than the first removal rate as the rigid, fixed abrasive polishing pad approaches the abrasive stop layer.

24. The fabrication method of claim 23, wherein the planarizing of the first interlayer dielectric layer further comprises:
    removing material from the first interlayer dielectric layer at a third removal rate less than the second removal rate after the rigid, fixed abrasive polishing pad makes contact with abrasive stop layer.

25. The fabrication method of claim 24, wherein at least one of the second and third removal rates is defined in relation to the slurry.

* * * * *